(12) United States Patent
Tanaka et al.

(10) Patent No.: US 7,189,081 B2
(45) Date of Patent: Mar. 13, 2007

(54) METHOD OF MOUNTING TERMINAL AND TERMINAL MOUNTING STRUCTURE

(75) Inventors: Yoshiyuki Tanaka, Shizuoka (JP); Hiroyuki Ashiya, Shizuoka (JP); Yayoi Maki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/341,468

(22) Filed: Jan. 14, 2003

(65) Prior Publication Data

US 2003/0134528 A1 Jul. 17, 2003

(30) Foreign Application Priority Data

Jan. 16, 2002 (JP) ............... P2002-006994

(51) Int. Cl.
*H01R 12/00* (2006.01)

(52) U.S. Cl. ...................... 439/76.2; 439/949

(58) Field of Classification Search ........... 439/75, 439/76.2, 66, 76.1, 752, 949
See application file for complete search history.

(56) References Cited

U.S. PATENT DOCUMENTS

| | | | |
|---|---|---|---|
| 3,264,597 A * | 8/1966 | Gammel, Sr. ........... | 439/80 |
| 4,530,554 A * | 7/1985 | Velsher et al. ............ | 439/62 |
| 4,533,203 A * | 8/1985 | Feldman et al. .......... | 439/64 |
| 4,738,625 A * | 4/1988 | Burton et al. ............. | 439/59 |
| 4,875,863 A * | 10/1989 | Reed ........................ | 439/79 |
| 5,240,422 A * | 8/1993 | Kobayashi et al. ....... | 439/78 |
| 5,764,487 A | 6/1998 | Natsume | |
| 6,126,457 A | 10/2000 | Smith et al. | |
| 6,171,133 B1 * | 1/2001 | Altuner et al. ........... | 439/381 |
| 6,217,341 B1 * | 4/2001 | Glick et al. .............. | 439/66 |
| 6,244,877 B1 * | 6/2001 | Asao ........................ | 439/76.2 |
| 6,283,769 B1 * | 9/2001 | Asao et al. ............... | 439/76.2 |
| 6,309,244 B1 | 10/2001 | Gundermann et al. | |
| 6,325,642 B2 * | 12/2001 | Asao ........................ | 439/76.2 |
| 6,491,527 B1 * | 12/2002 | Smith ...................... | 439/66 |
| 6,520,780 B2 * | 2/2003 | Chemin ................... | 439/76.2 |

(Continued)

FOREIGN PATENT DOCUMENTS

EP 0 939 453 A2 9/1999

(Continued)

OTHER PUBLICATIONS

Office Action mailed by the Japanese Patent Office on Aug. 1, 2006.

(Continued)

*Primary Examiner*—Tho D. Ta
*Assistant Examiner*—Larisa Tsukerman
(74) *Attorney, Agent, or Firm*—Finnegan, Henderson, Farabow, Garrett & Dunner, L.L.P.

(57) ABSTRACT

The terminal mounting structure includes a board (21). The structure includes a terminal (26) mounted on the board. The terminal includes a first end (26*a*) removably connected to a connection component (16, 17, 18). The terminal includes a second end (26*b*) soldered to the board in a raised position. The terminal includes a bent portion (26*d*) at intermediate of the terminal and at respective angles relative to respective first and second ends. The structure includes a retaining member (30, 40) facing the board with a space therebetween, and retaining the bent portion.

12 Claims, 18 Drawing Sheets

U.S. PATENT DOCUMENTS

| | | | |
|---|---|---|---|
| 6,527,989 B1 * | 3/2003 | Onoda | 264/40.1 |
| 6,579,105 B2 * | 6/2003 | Keyser | 439/66 |
| 6,590,780 B2 * | 7/2003 | Modi | 361/752 |
| 6,592,382 B2 * | 7/2003 | Wurster | 439/82 |
| 6,808,397 B2 * | 10/2004 | Kondo | 439/76.2 |
| 6,837,746 B2 * | 1/2005 | Okamoto | 439/606 |
| 6,870,096 B2 * | 3/2005 | Suzuki et al. | 174/50 |
| 6,905,348 B2 * | 6/2005 | Naitou et al. | 439/76.2 |
| 6,942,499 B2 * | 9/2005 | Tanaka et al. | 439/76.2 |
| 6,984,133 B2 * | 1/2006 | Naitou et al. | 439/76.2 |
| 7,101,197 B2 * | 9/2006 | Naito et al. | 439/75 |
| 2006/0089019 A1 * | 4/2006 | Mitani | 439/76.2 |

FOREIGN PATENT DOCUMENTS

| | | |
|---|---|---|
| JP | H06-076873 A | 3/1994 |
| JP | H09-213389 A | 8/1997 |
| JP | H10-233269 A | 9/1998 |
| JP | 11-102749 | 4/1999 |
| JP | 2000-294348 A | 10/2000 |
| JP | 2001-307802 A | 11/2001 |

OTHER PUBLICATIONS

European Search Report.

* cited by examiner

METHOD OF MOUNTING TERMINAL AND TERMINAL MOUNTING STRUCTURE

BACKGROUND OF THE INVENTION

1. Field of the Invention

The present invention relates to a method for mounting a terminal and a terminal mounting structure. For example, a terminal for a large current is mounted, using a solder, on a printed board, which is adapted to an electronic control unit (ECU) of an automotive.

2. Description of Relevant Art

A terminal mounting structure is disclosed in, for example, Japanese Patent Application Laid-Open Publication NO. HEI11-102749. The structure includes a straight terminal, which is inserted into a hole through a plate and a connecting hole on a printed board. The end of the terminal, projecting from the connecting hole, is fixed to the printed board, using a solder.

The terminal mounted by the solder has another end mated with a connecting component as a connector structure, such as a fuse or a relay for energization.

SUMMARY OF THE INVENTION

The terminal mounting structure, however, has a hard plate and board with respective thermal expansion coefficients different from each other. For example, the terminal mounting structure is adapted to an electric connection box mounted on a vehicle. Heat generation due to an engine causes a difference between the thermal expansions of the plate and board. The difference is applied to the soldered portion to be easily cracked.

The invention is directed to a method of mounting a terminal and a terminal mounting structure. An intermediate portion of a terminal relieves thermal expansion stress and mechanical stress, which are applied to a soldered portion, thus preventing solder-crack from occurring.

The first aspect of the invention is directed to a terminal mounting structure. The structure includes a first component. The structure includes a second component separated away from the first component. The structure includes a terminal for interconnecting the first and second components. The terminal includes a first portion mounted to the first component. The terminal includes a second portion mounted to the second component. The terminal includes a deformable third portion interconnecting the first and second portions and extending transversely to the first and second portions.

Preferably, the terminal mounting structure further includes a retaining member retaining the third portion, with a space between the retaining member and the one of the first and second components.

The second aspect of the invention is directed to a terminal mounting structure. The structure includes a board. The structure includes a terminal mounted on the board. The terminal includes a first end removably connected to a connection component. The terminal includes a second end soldered to the board in a raised position. The terminal includes a bent portion at intermediate of the terminal and at respective angles relative to respective first and second ends. The structure includes a retaining member facing the board with a space therebetween, and retaining the bent portion.

The third aspect of the invention is directed to a method of mounting a terminal. The method includes the step of forming a bent portion between first and second ends of a terminal with respective angles relative to corresponding first and second ends. The method includes the step of facing a retaining member to a board with a space for retaining the bent portion. The method includes the step of removably connecting a first end of a terminal to a connection component and mounting a second end of the terminal to a board in a raised position.

BRIEF DESCRIPTION OF THE ACCOMPANYING DRAWINGS

DETAILED DESCRIPTION OF THE PREFERED EMBODIMENT

Figure 1:
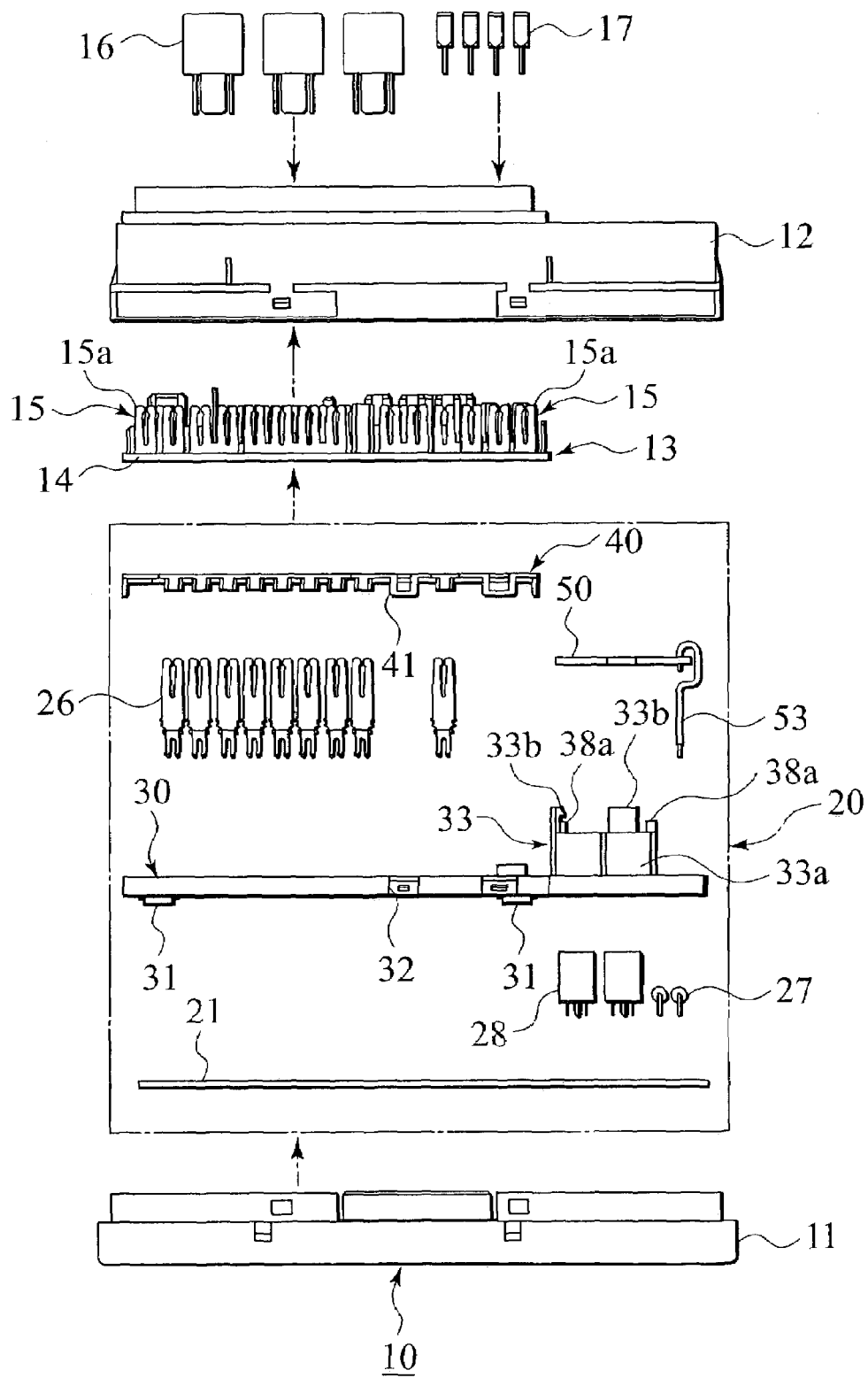
FIG. 1 is an exploded front view showing an electronic control unit integrated type connection box of an embodiment of the present invention.
Figure 2:
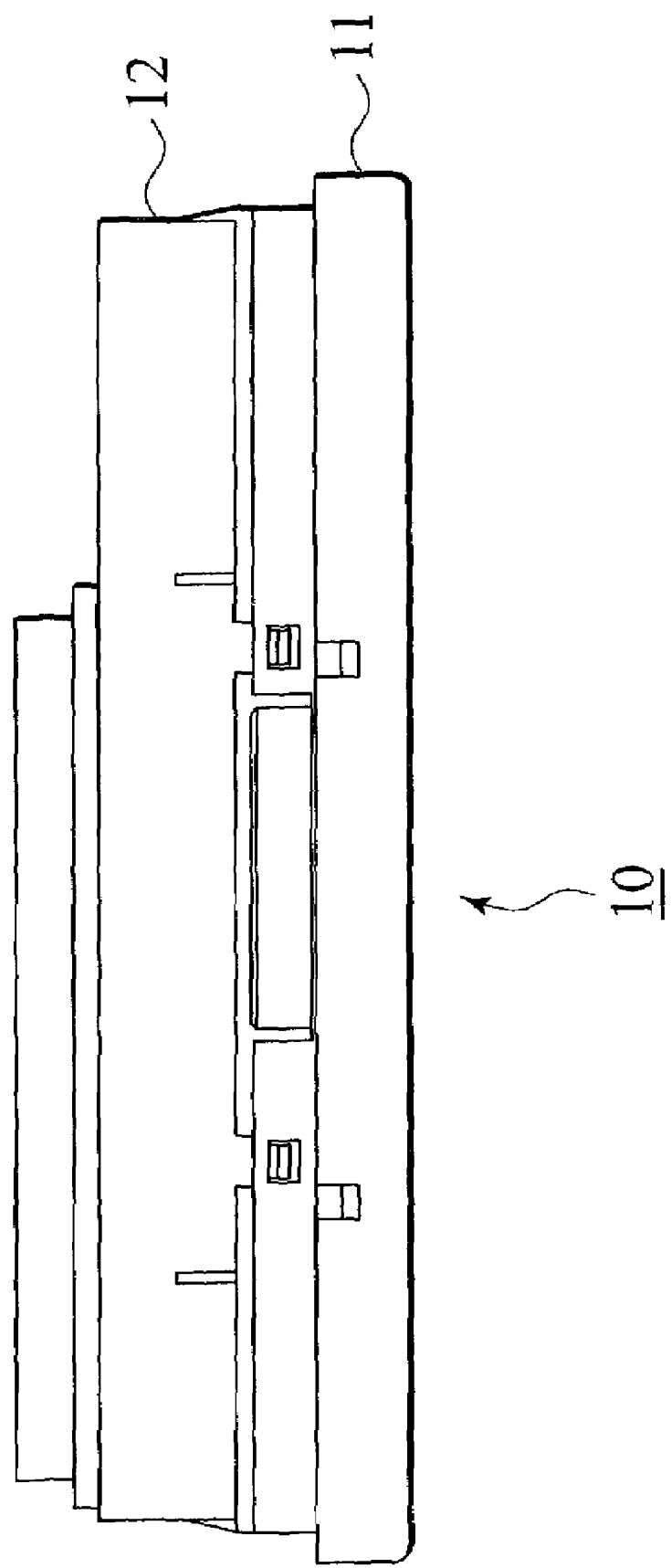
FIG. 2 is a front view of the connection box.
Figure 3:
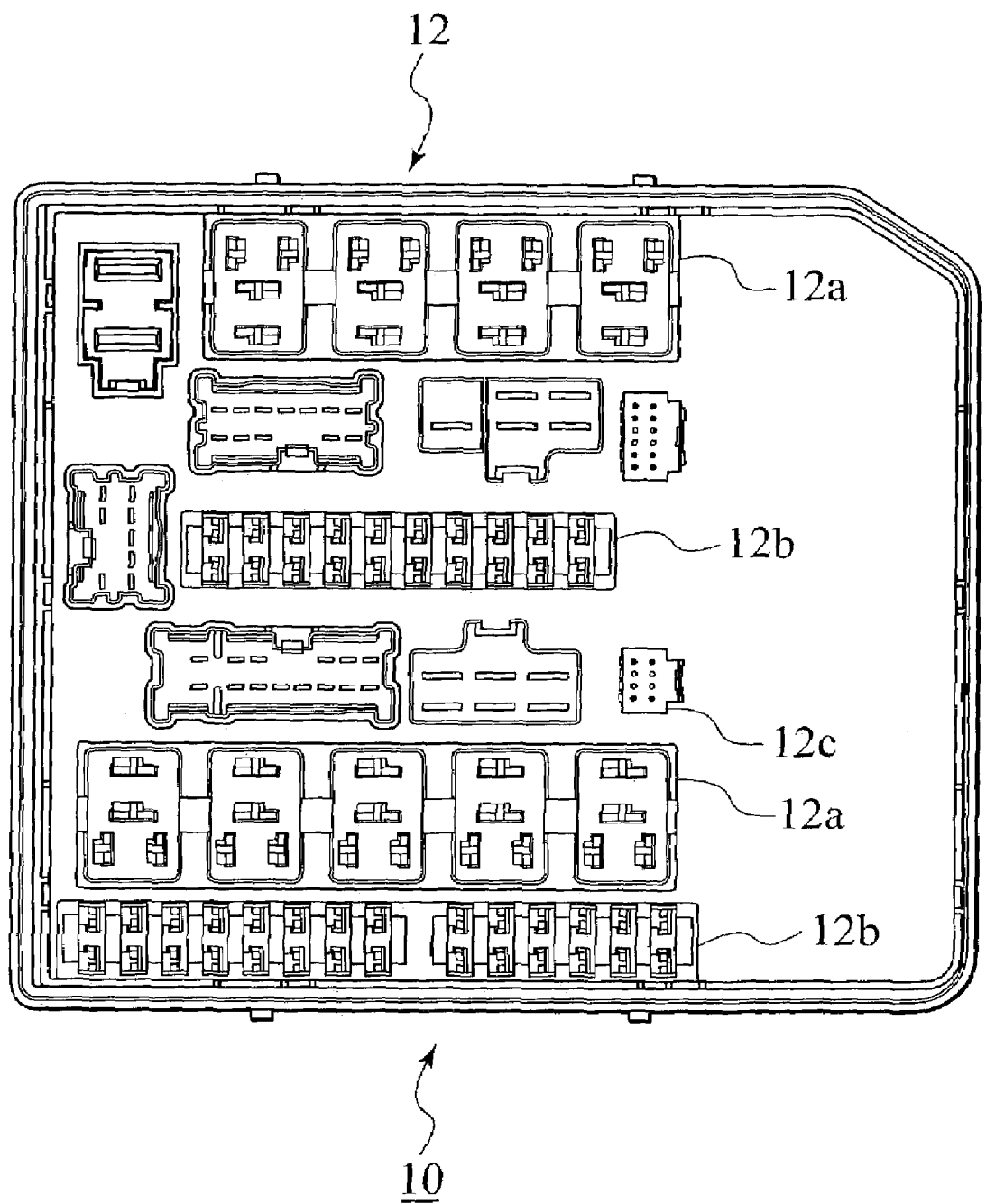
FIG. 3 is a plan view of the connection box.
Figure 4:
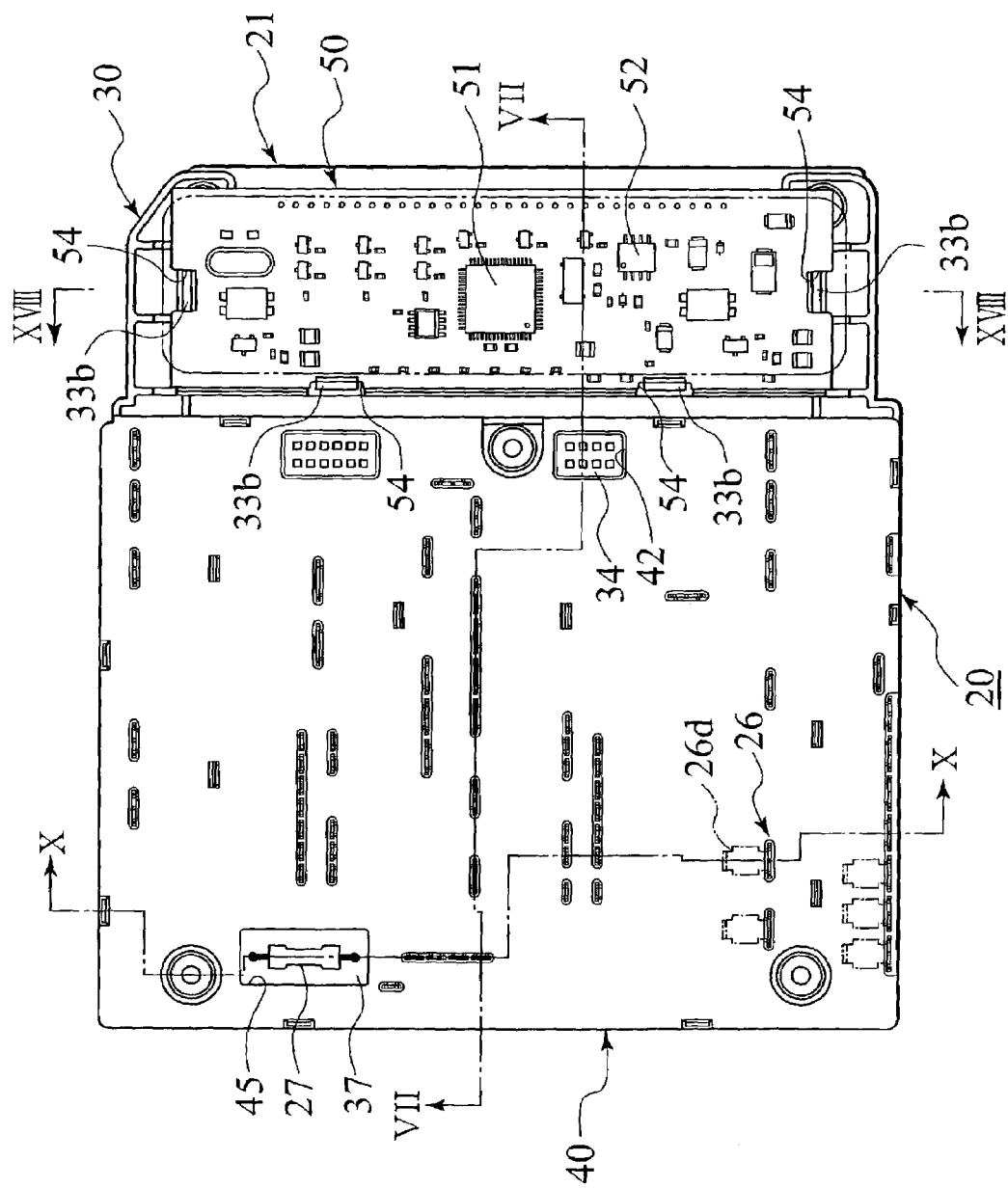
FIG. 4 is a plan view of an electronic control unit incorporated in the connection box.
Figure 5:
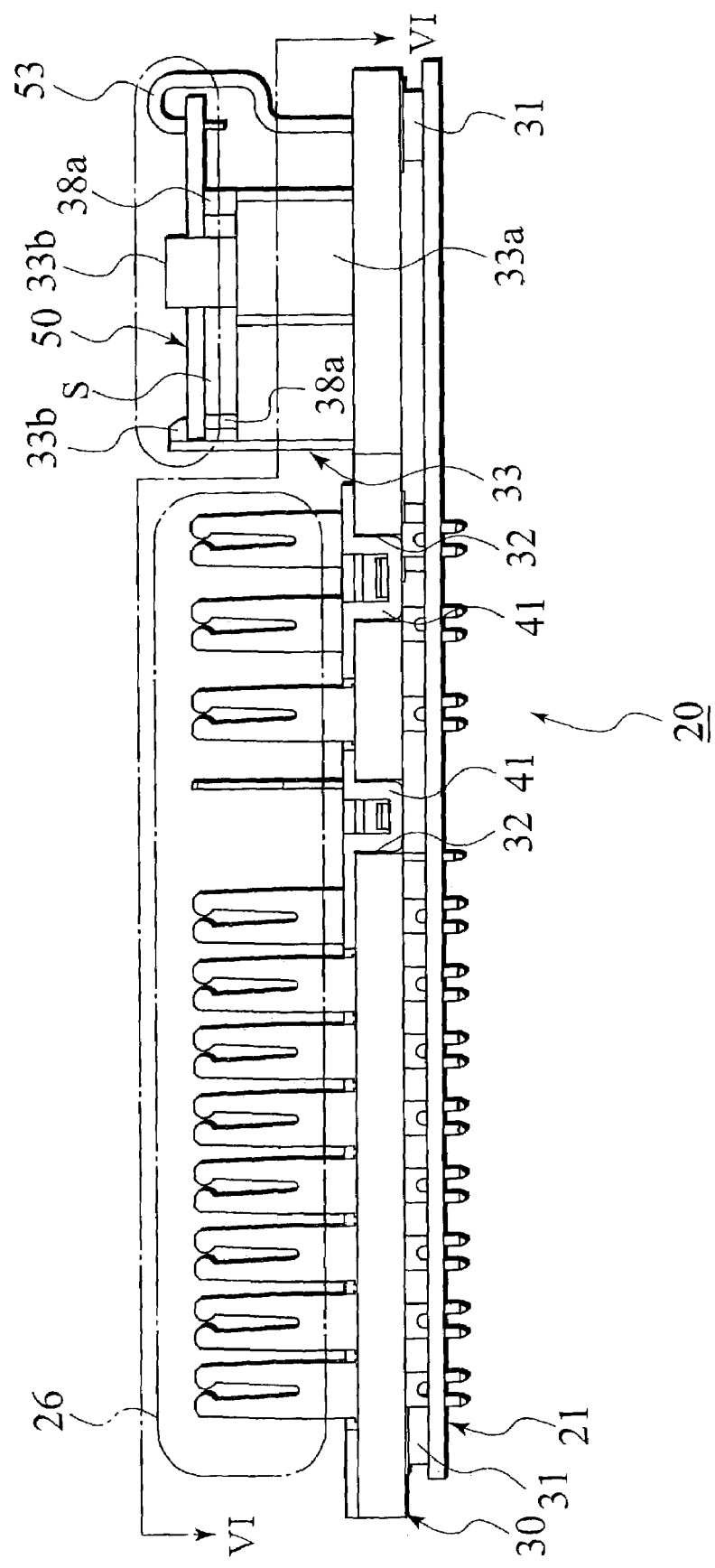
FIG. 5 is a front view of the electronic control unit.
Figure 6:
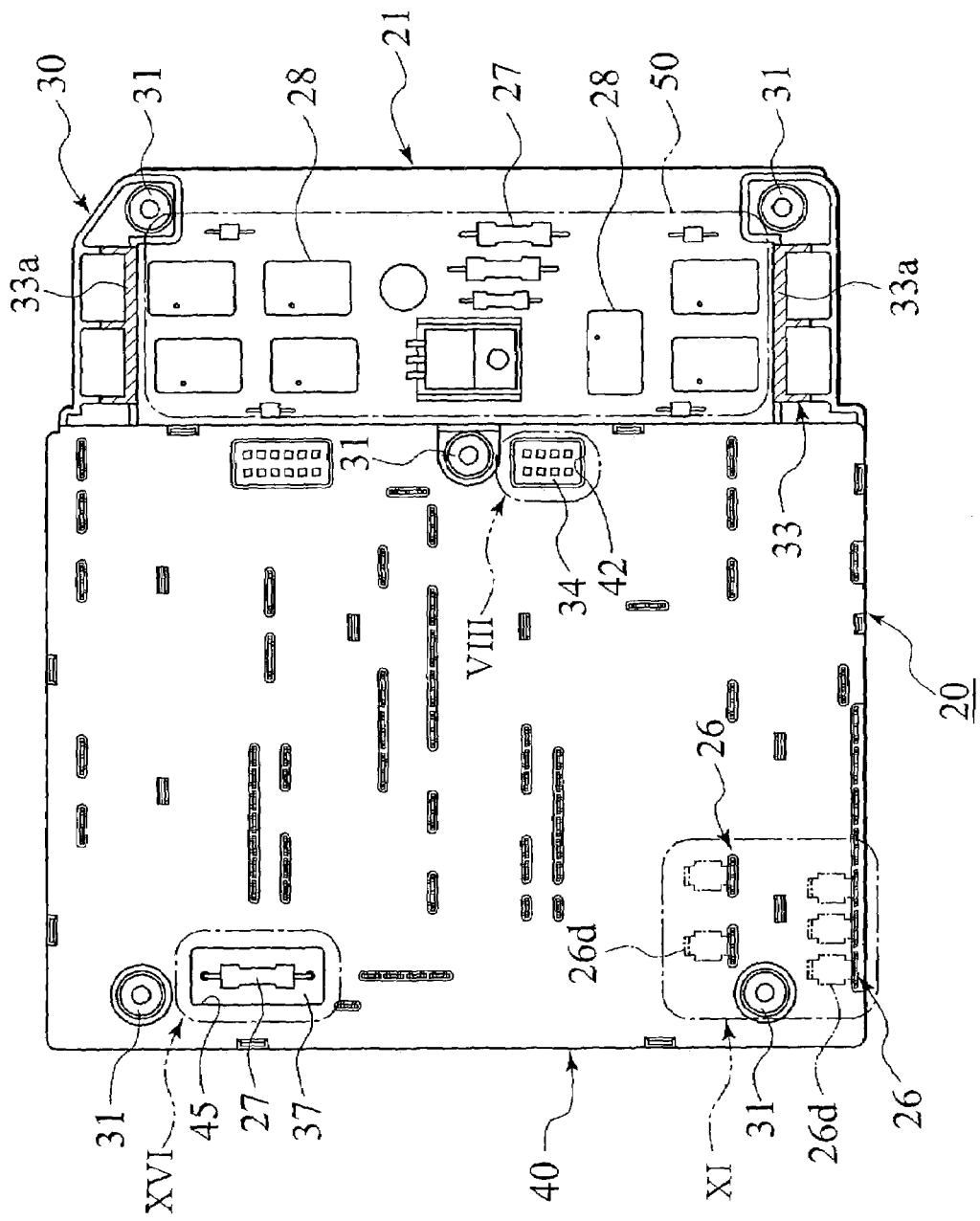
FIG. 6 is a sectional view taken along a line VI—VI of FIG. 5.
Figure 7:
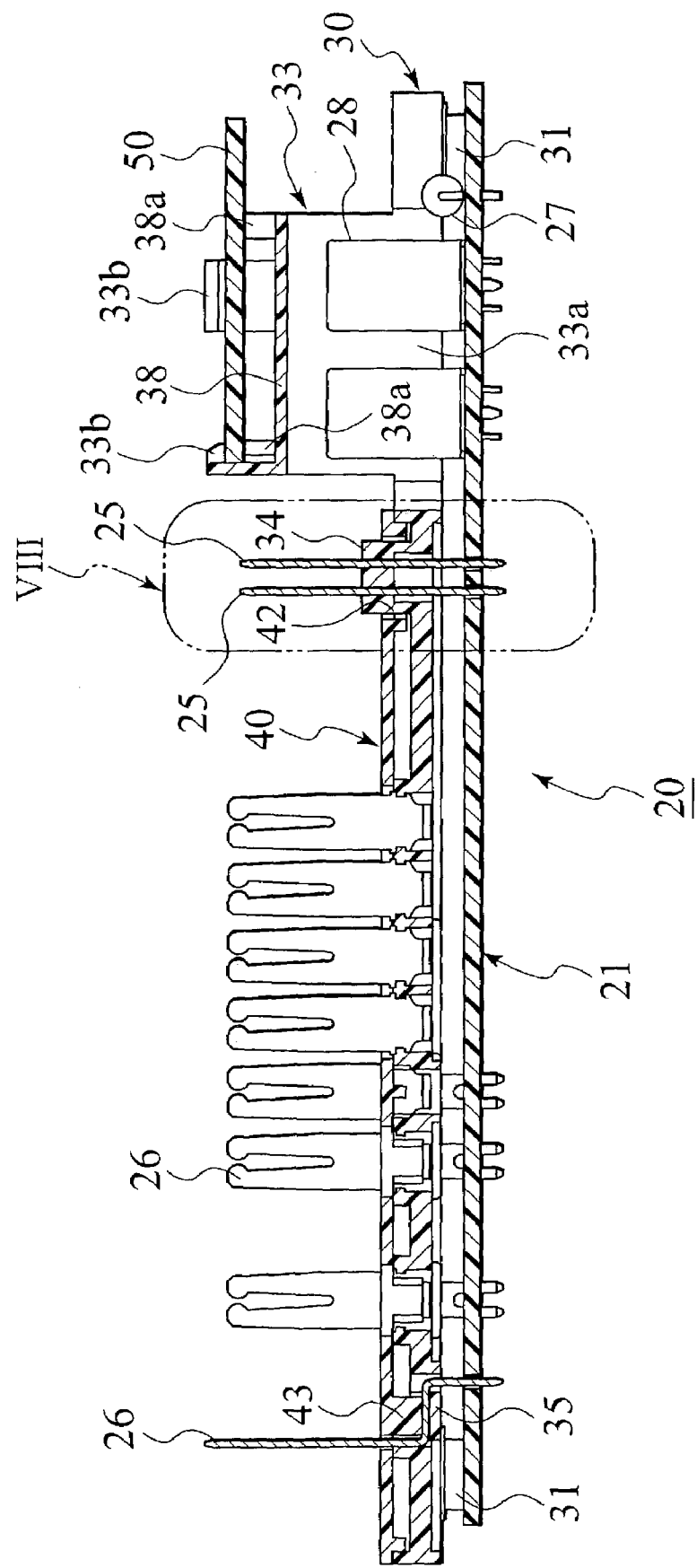
FIG. 7 is a sectional view taken along a line VII—VII of FIG. 4.
Figure 8:
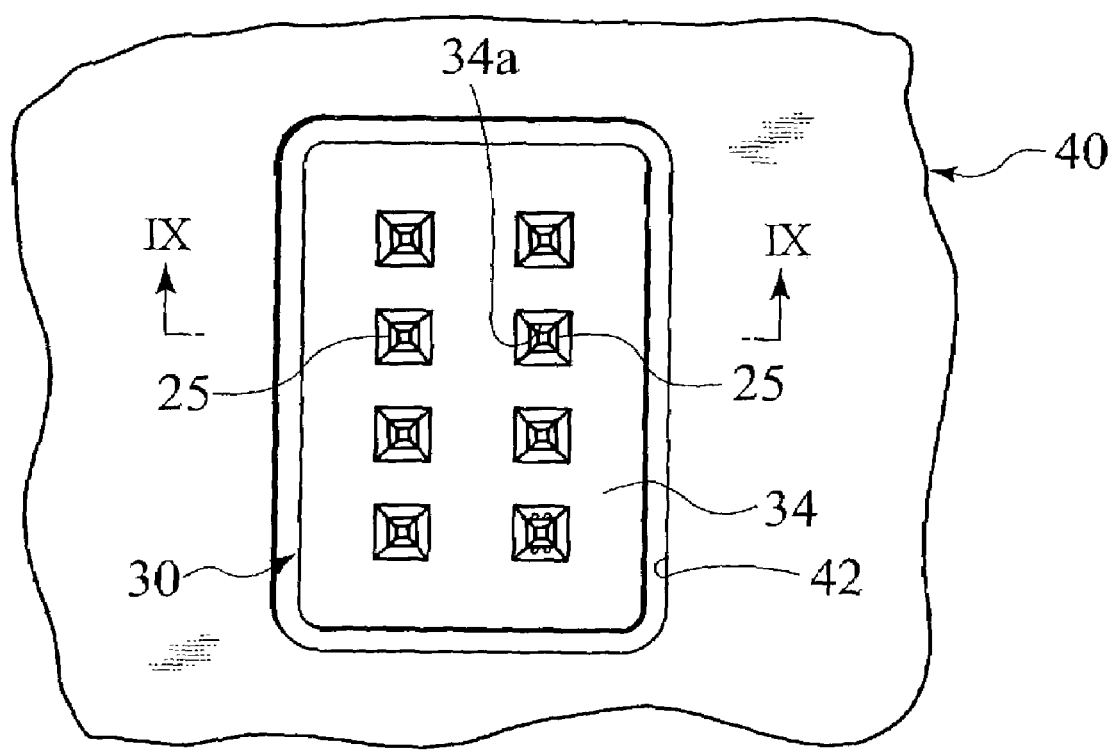
FIG. 8 is an enlarged plan view of an area VIII of FIG. 6.
Figure 9:
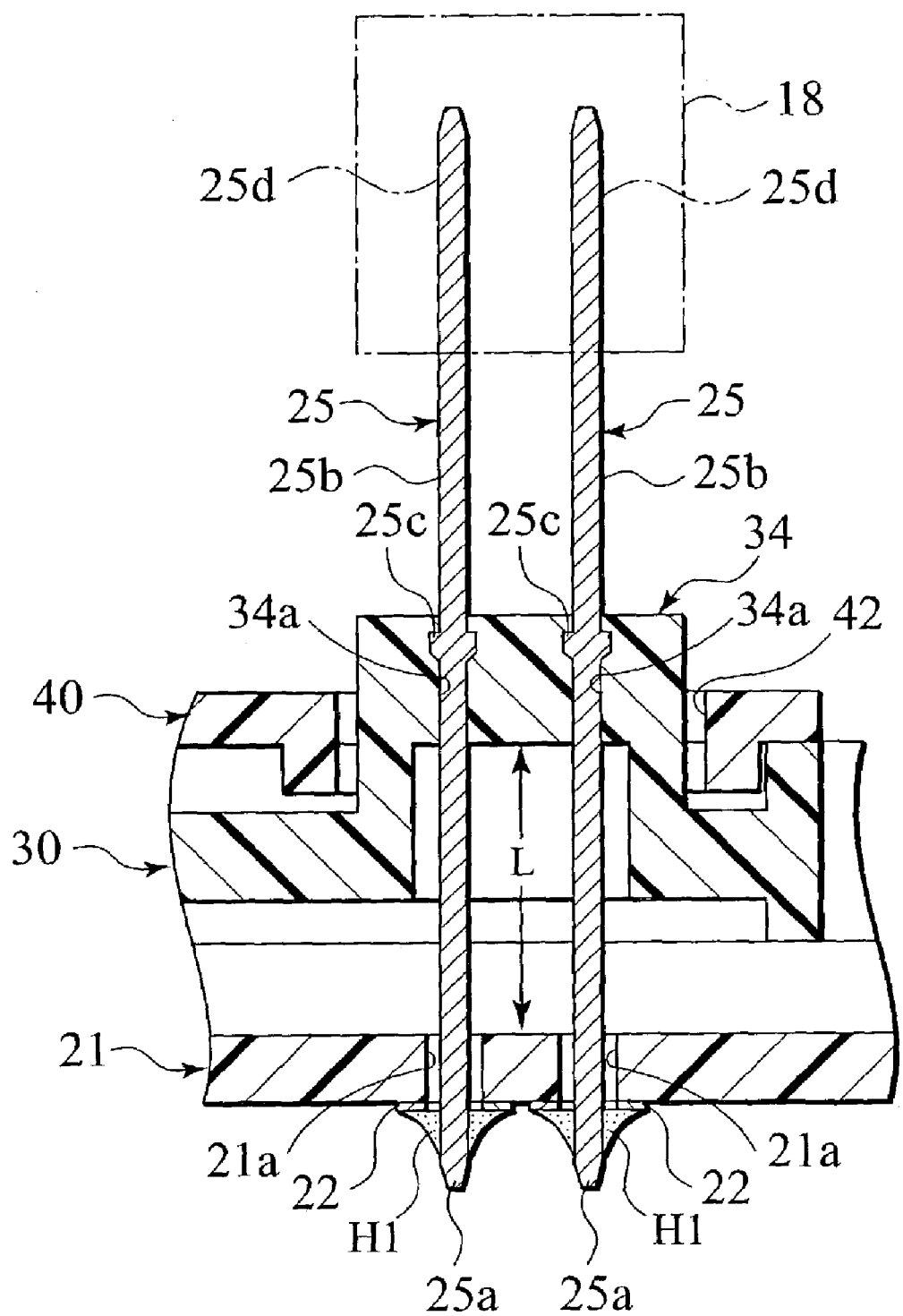
FIG. 9 is a sectional view of a main portion taken along a line IX—IX of FIG. 8.
Figure 10:
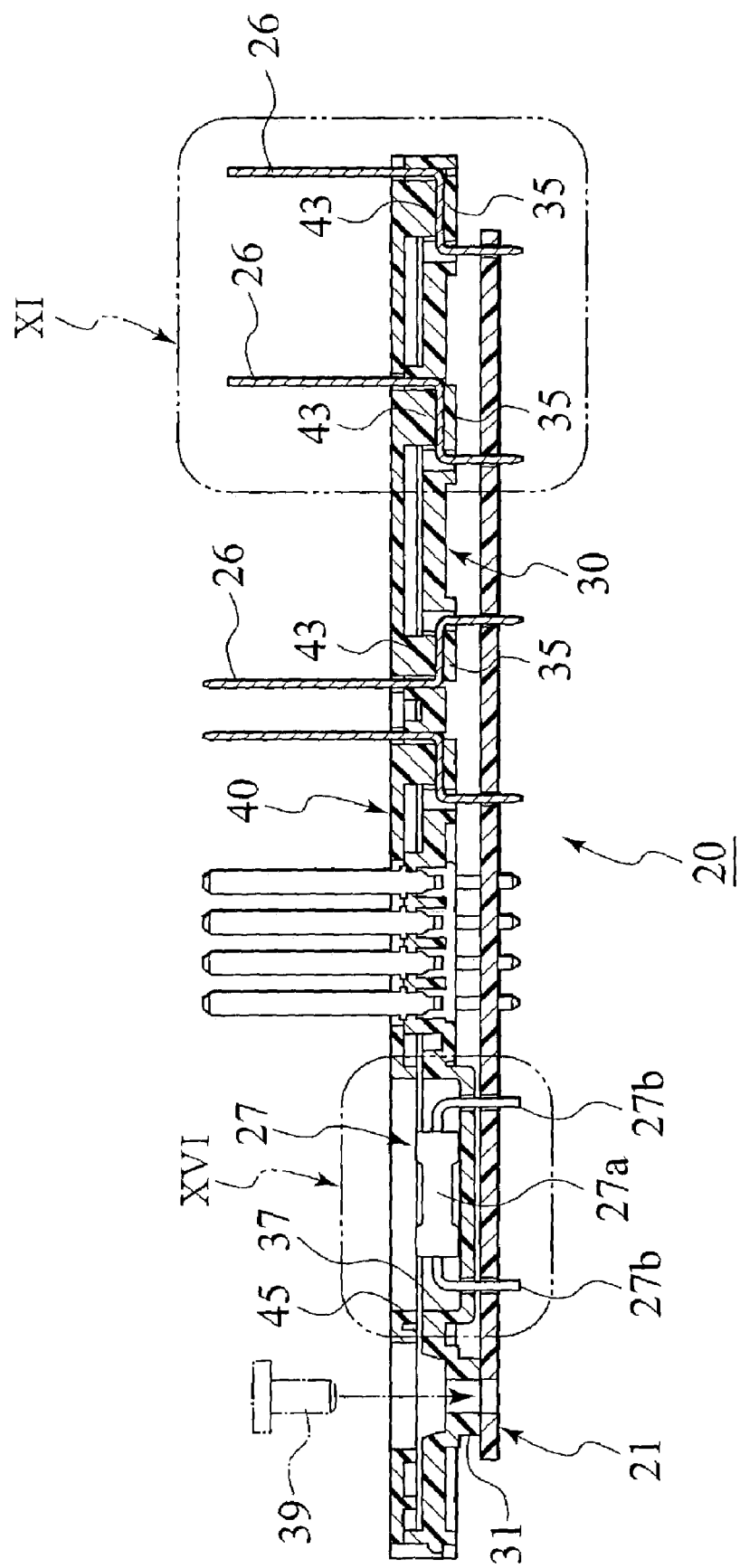
FIG. 10 is a sectional view taken along a line X—X of FIG. 4.

Next, a description will be made for an embodiment of the present invention with reference to the drawings.

As shown in FIGS. 1 to 13, electronic control unit integrated type connection box 10 includes box-shaped upper case 11 made of synthetic resin. Box 10 includes box-shaped main cover 12 made of synthetic resin, which is fitted to upper case 11 so as to be latched/unlatched therewith. Box 10 includes bus bar layer 13, which is arranged on an upper face inside cover 12. Box 10 includes ECU (electronic control unit) 20, which is incorporated between the case 11 and the cover 12 under bus bar layer 13.

Connection box 10 is mainly used, for example, for distribution of power supply in a vehicle. Electronic control unit 20, for example, controls on/off of an engine, a light, or a wiper of a vehicle.

As shown in FIG. 1, bus bar layer 13 includes a plurality of bus bars 15, which are arranged on insulated board 14. Each of bus bars 15 include displacing part 15a with a slit blade on one end thereof and displacing part 15a bent upward. Displacing parts 15a extend to relay mounting parts 12a and fuse mounting part 12c shown in FIG. 3 and project therefrom. Each of mounting parts 12a and 12b integrally projects from the upper face of cover 12. Plug-in relays 16 are mounted on relay mounting part 12a as an electronic component. Fuse 17 is mounted on mounting part 12b as an electronic component.

As shown in FIGS. 1, 4, 5, 7, 10, and 19, control unit 20 includes rectangular main board 21 made of synthetic resin. On this board, electronic components resistors 27 and relays 28 are mounted alongside straight and crank-shaped terminals 25 and 26. Unit 20 includes terminal plate (heat insulated plate) 30 made of synthetic resin. Plate 30 has a bottom face to which main board 21 is fixed with screws 39 so as to face the bottom face with a predetermined clearance therebetween through a plurality of tubular bosses 31 interposed therebetween.

Unit 20 includes plate-shaped plate cover 40 made of synthetic resin. Cover 40 faces a part of an upper face of terminal plate 30 (except a region of frame-shaped retaining plate 33) with a predetermined clearance therebetween through a plurality of projections 41 as hooks interposed therebetween. Projections 41 mate with a plurality of recesses 32 in terminal plate 30.

Unit 20 includes rectangular control board 50. Board 50 is stacked and retained at a predetermined distance above board 21 with a retaining plate 33 of terminal plate 30 interposed therebetween. On board 50, a plurality of control components 51 and 52 of a CPU are mounted. Board 50 is connected to board 21 through jumper 53 and terminals omitted from the drawings.

As shown in FIGS. 6 to 9, in assembling board 21 to plate 30, soldered parts 25a on lower ends of bar-shaped terminals are guided by plate 30 to respective connection holes 21a of board 21. When board 21 is assembled to plate 30, positions of holes 21a and positions of positioning holes 34a of plate 30 conform to each other. Plate 30 retains intermediate portions 25b between holes 21a and terminals 25. Holes 21a faces plate with a predetermined clearance therebetween. Soldered parts 25a are guided and inserted into respective holes 21a.

Soldered parts 25a are soldered to respective lands 22 and retained on board 21. The lands 22 are formed on the lower face of board 21 in a state where terminals 25 are erected vertically. These soldered areas (solder fillet) are indicated by the reference character H1.

Intermediate portions 25b of terminals 25 includes annular projections (latch part) 25c. Projections 25c are latched in holes 34a of terminal plate 30 and integrally projected therefrom. A plurality of holes 34a are provided in two rows in the middle of terminal press-in part 34. Press-in part 34 projects from the upper face of terminal plate 30 in a block shape. Press-in part 34 projects upward from opening 42 of cover 40. Upper ends 25d of terminals 25 are exposed from press-in part 34 and project to mounting part 12c (see FIG. 3) of cover 12. Upper ends 25d mate with external connector 18 as an electronic component.

Each of projection parts 25c of terminals 25 is pressed into a predetermined position within hole 34a to be latched. In this latched state, projection parts 25c are satisfactorily latched, secured from mechanical stress induced by attachment/detachment of connector 18.

As shown in FIG. 4 and FIGS. 10 to 13, each overall broad terminals 26 for large current has upper end (one end) 26a, which is to be a displacing part with a slit blade. Upper ends 26a are connected to heat generating components such as plug-in relays 16 and fuse 17 and connector 18 as connector components. The present invention is applied to these terminals 26.

Figure 13:
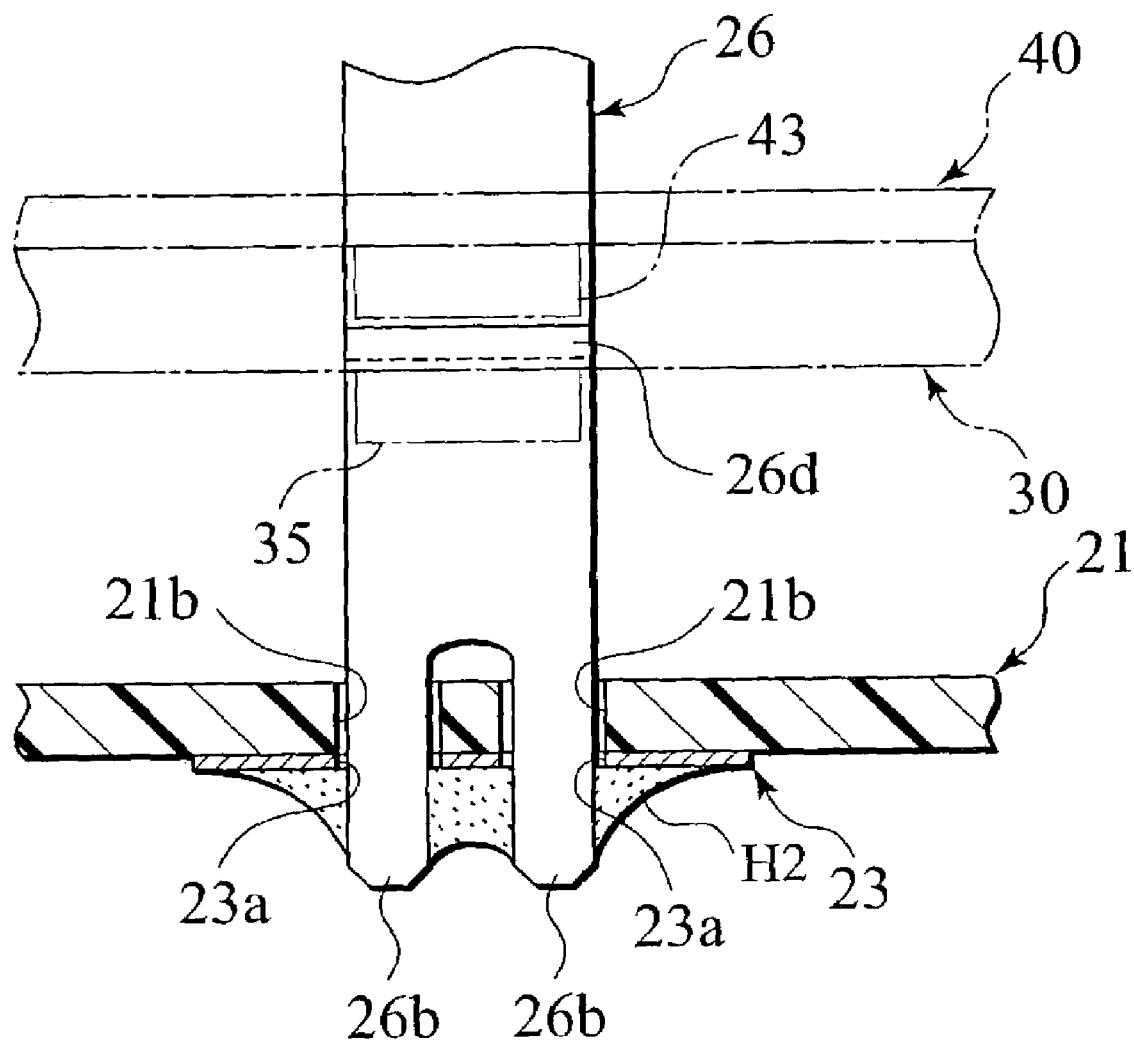
FIG. 13 is a sectional view taken along a line XIII—XIII of FIG. 11.

In FIG. 13, the lower end (the other end) of terminal 26 is bifurcated to be a pair of soldered parts 26b. Soldered parts 26b are inserted into respective holes 21b of board 20 in a state where soldered parts 26b are erected vertically. Soldered parts 26b are soldered to land 23 on the lower face of main board 21 and retained by main board 21. This soldered area (solder fillet) is indicated by reference character H2.

Figure 11:
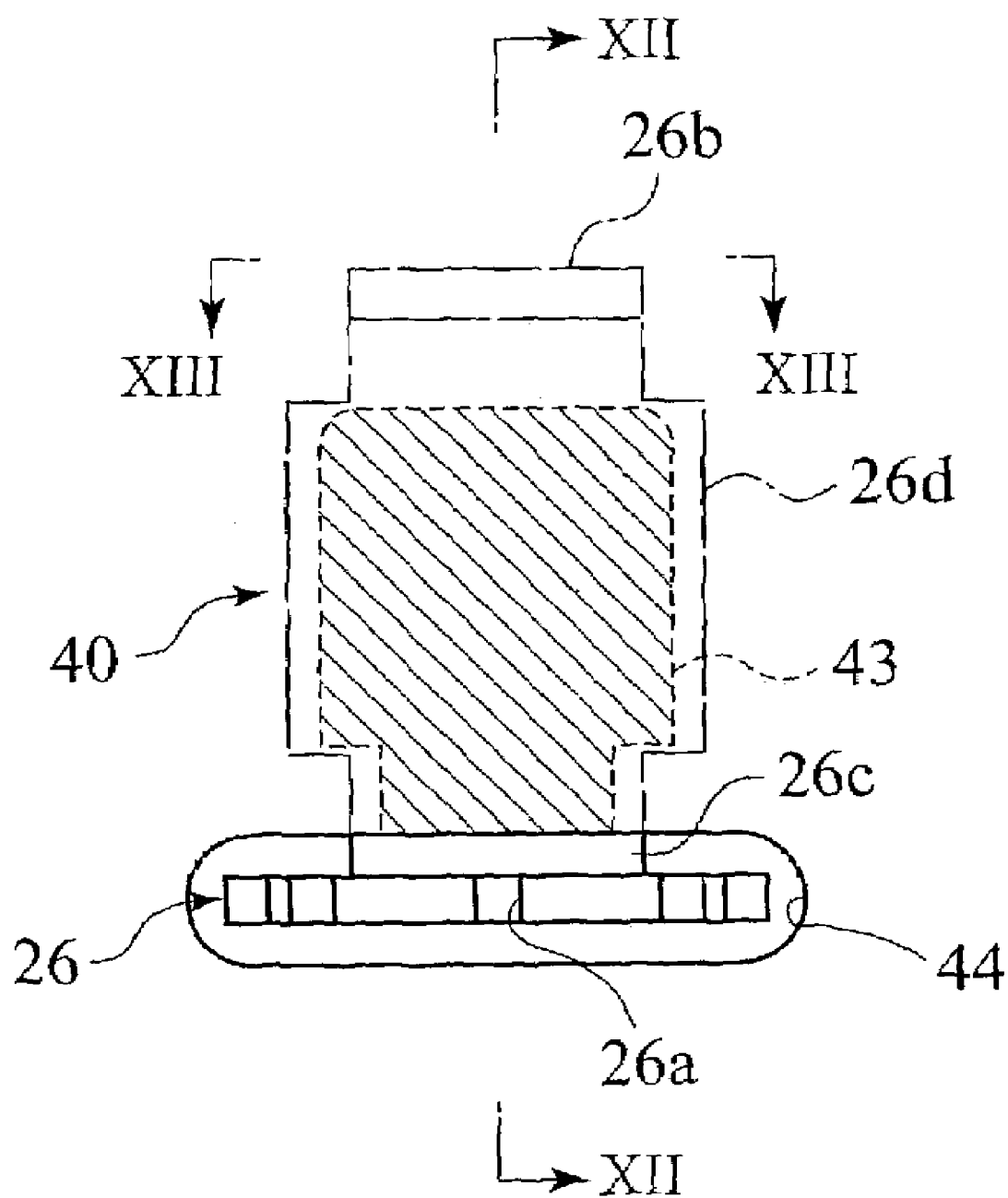
FIG. 11 is a partial enlarged plan view of an area XI of FIG. 6.
Figure 12:
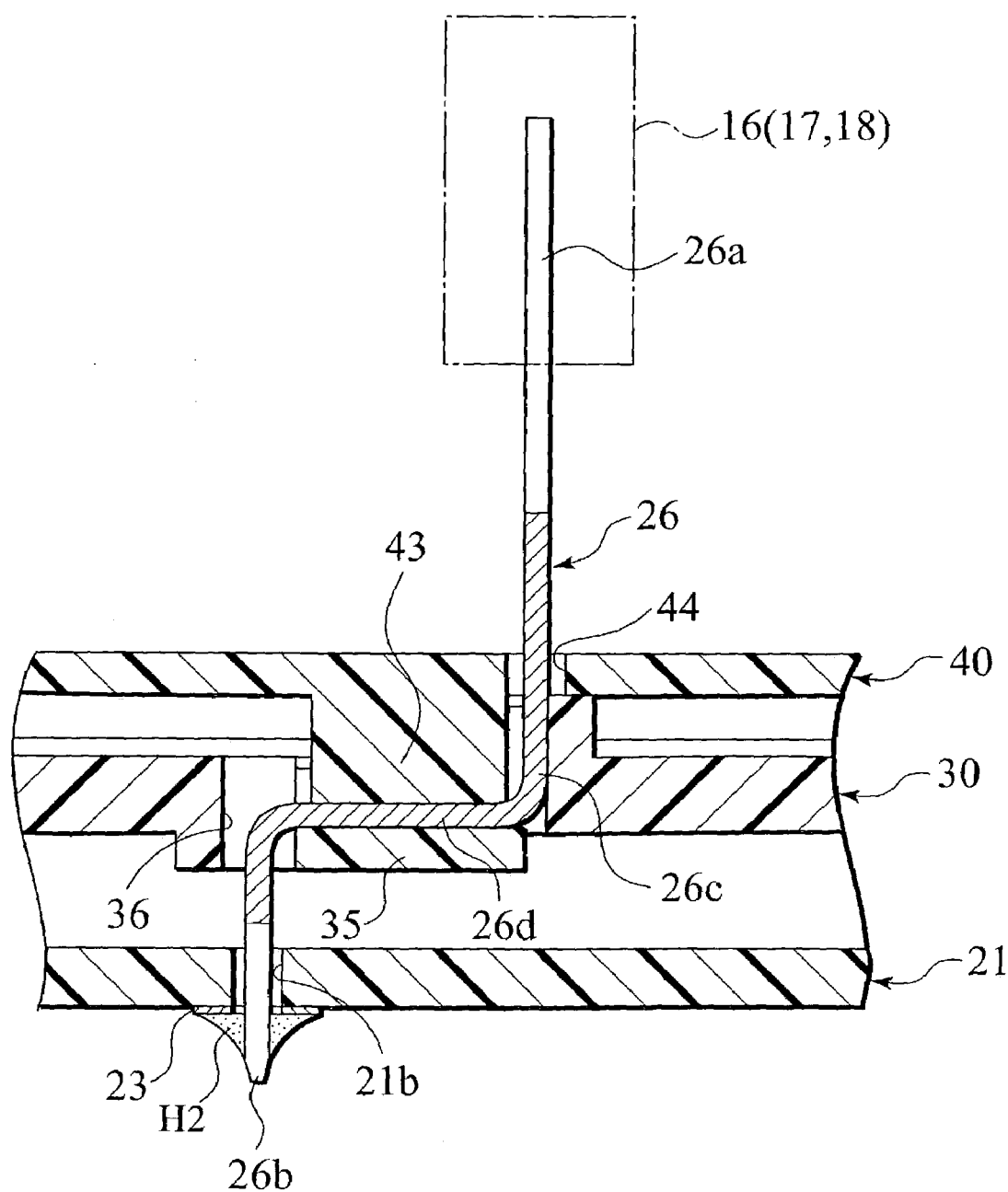
FIG. 12 is a sectional view taken along a line XII—XII of FIG. 11.

Retaining members, plate 30 and cover 40 retain in place intermediate part 26c of each terminal 26. In a method of attaching terminal 26, as shown in FIG. 11, intermediate part 26c is bent at predetermined angles with respect to both of one end 26a as the displacing part, and end 26b to form bent part 26d. Terminal 26 is shaped overall in a crank form. In FIG. 12, this bent part 26d is retained by the retaining members 30 and 40. Bent part 26d faces board 21 with a predetermined clearance therebetween.

Bent part 26d is bent widely to be parallel to board 21. Bent part 26d abuts on terminal pressing part 35 of plate 30. Bent part 26d abuts on terminal pressing part 43 of cover 40. Cover 40 covers plate 30 with a predetermined clearance from plate 30. Bent part 26d is retained between pressing part 35 and pressing part 43 of cover 40.

In vicinities of pressing parts 35 and 43 of plate 30 and cover 40, insertion holes 36 and 44 are formed, respectively. Displacing part 26a projects from hole 44 of cover 40 to mounting parts 12a, 12b and 12c of cover 12. As shown by a shaded area in FIG. 11, pressing part 43 is formed to be broad into a substantially same shape as that of bent portion 26d (broad bent portion of terminal 26). As shown in FIG. 13, pressing part 35 of plate 30 is similarly formed.

Figure 14:
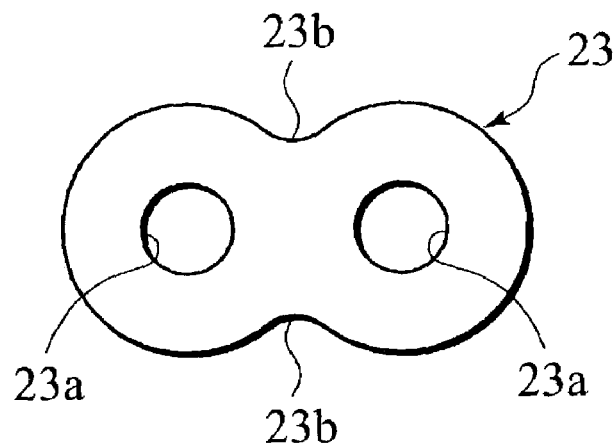
FIG. 14 is an explanatory view of a land part used in the electronic control unit.
Figure 15:
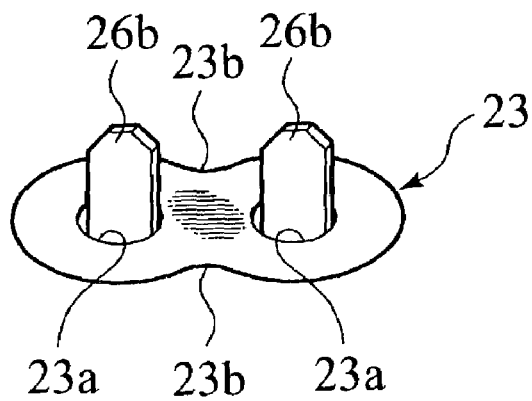
FIG. 15 is perspective view showing a relation between the land part and a terminal.
Figure 16:
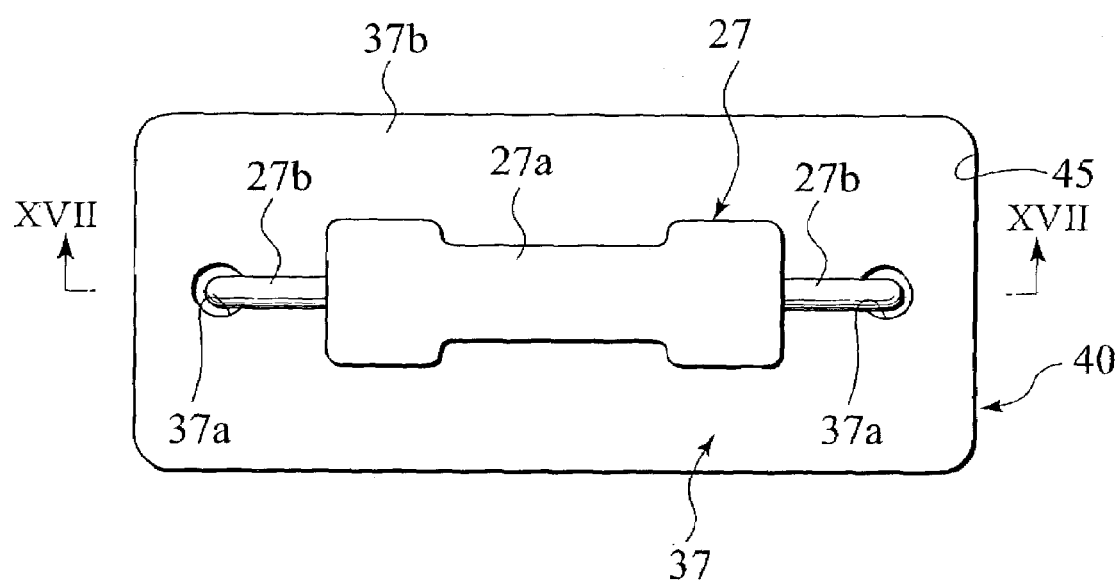
FIG. 16 is an enlarged plan view of an area XVI of FIG. 6.

As shown in FIGS. 13 and 15, terminal 26 is divided into two soldered parts 26b and thinned. A pair of holes 21b are formed in board 21 which face the pair of soldered parts 26b. As shown in FIGS. 13 to 15, land 23 includes a pair of round terminal insertion holes 23a, which face the pair of soldered parts 26b. A periphery of land 23 includes a pair of constricted potions 23b between the pair of holes 23a.

As shown in FIGS. 6, 10, 16, and 17, plate 30 includes concave parts housing part 37 at a predetermined position, which houses and retains resistor (heat generating) component 27. Housing part 37 and board 21 include a pair of insertion holes 37a and a pair of insertion holes 21c, respectively, into each of which a pair of leads 27b is inserted. Leads 27b project from part body 27a of resistor 27.

Figure 17:
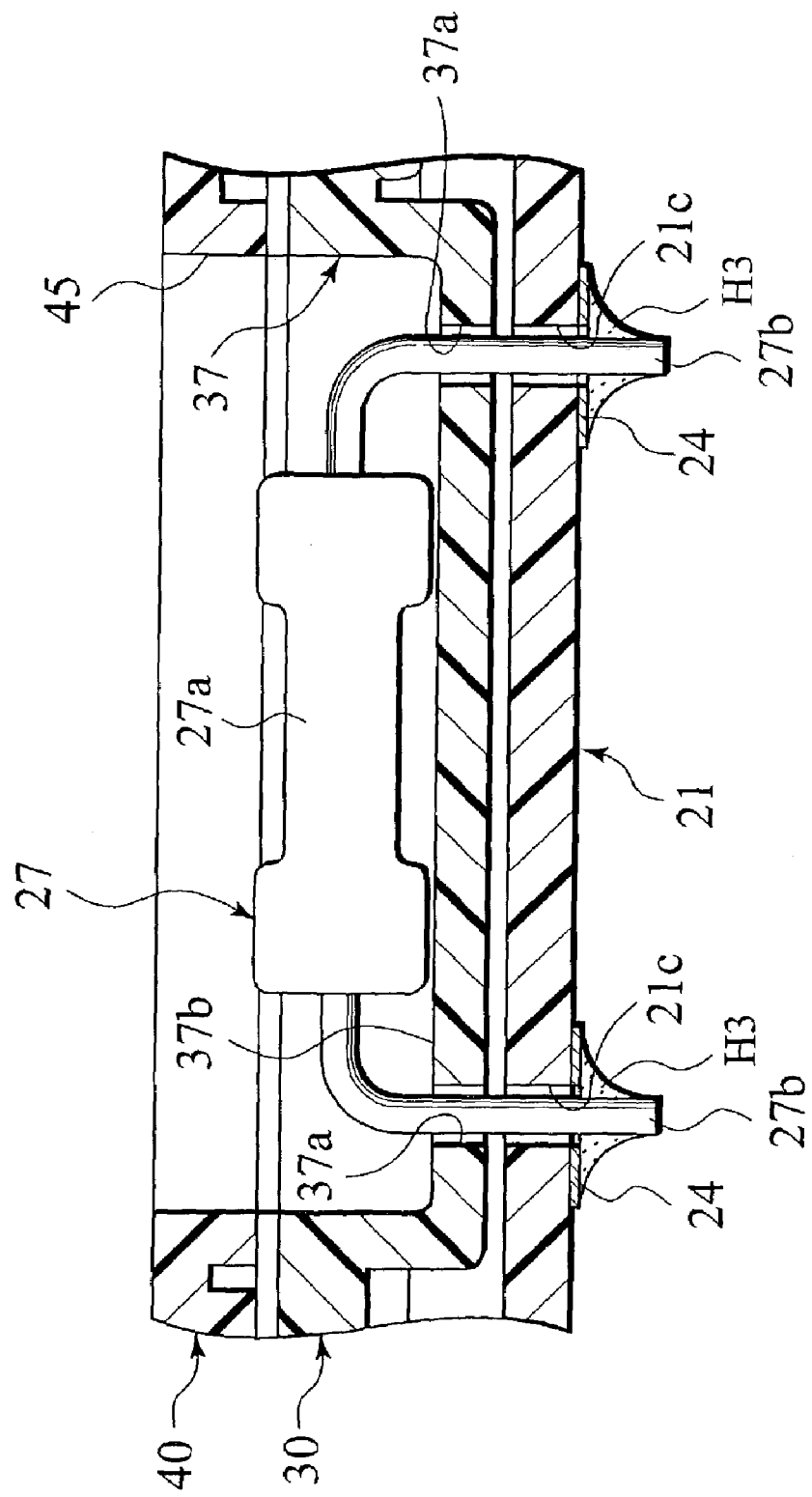
FIG. 17 is a sectional view taken along a line XVII—XVII of FIG. 16.
Figure 18:
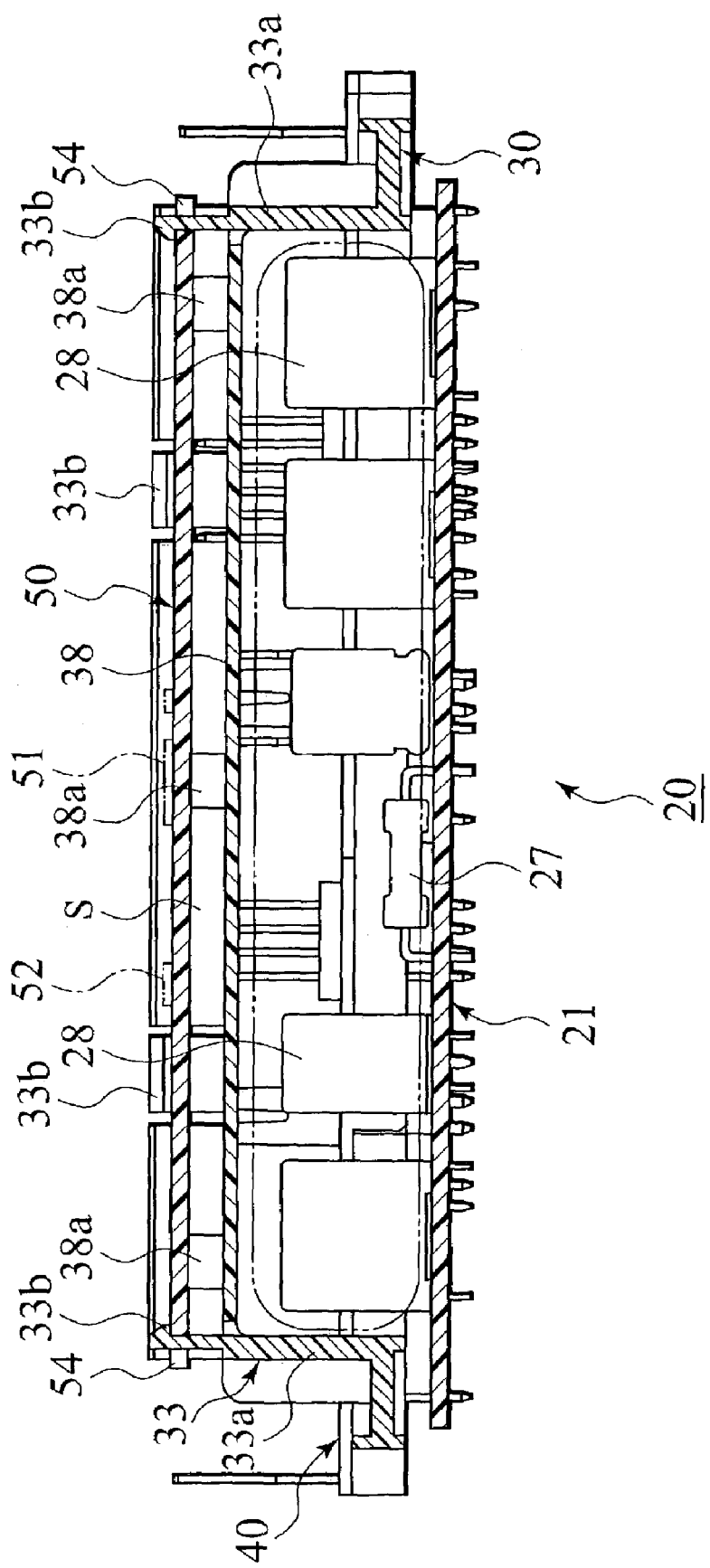
FIG. 18 is a sectional view taken along a line XVIII—XVIII of FIG. 4.
Figure 19:
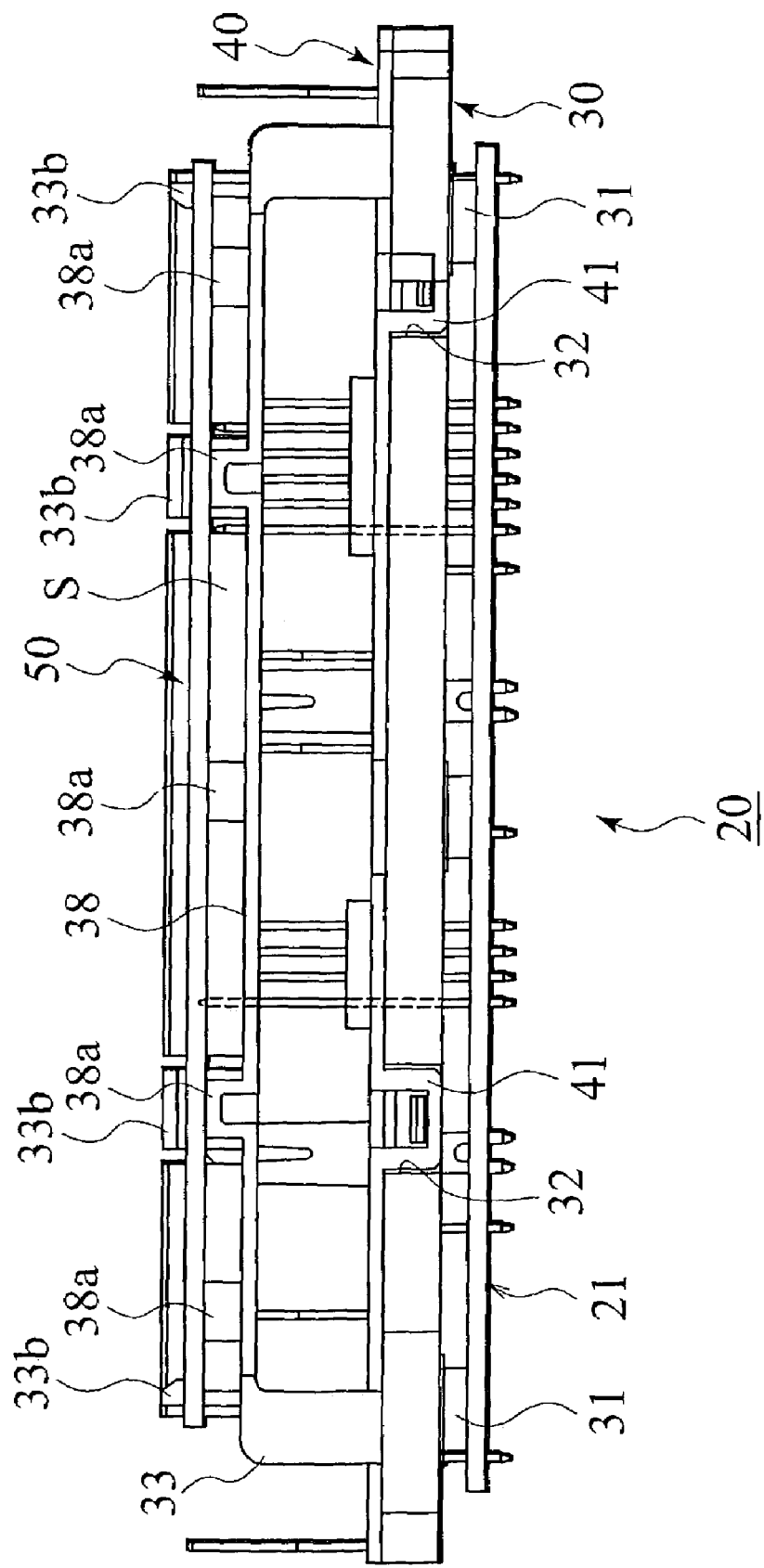
FIG. 19 is a right side view of the electronic control unit.

Leads 27b of resistor 27 are individually inserted into holes 37a and 21c. In FIG. 17, respective leads 27b and respective lands 24 are fixed to each other by soldering to be retained in a state where part body 27a of resistor 27 is spaced from bottom face 37b of housing part 37. This soldered area (solder fillet) is indicated by the reference character H3. Opening 45 of the same size and shape as housing part 37 is formed facing housing part 37.

As shown in FIGS. 5 to 7, and FIGS. 18 and 19, main board 21 and control board 50 are retained and stacked with a predetermined clearance therebetween. On board 21, heat generating components such as resistors 27 and relays 28 are mounted through retaining plate 33 interposed therebetween, retaining plate 33 projecting on the right of plate 30.

Retaining plate 33 includes a pair of sidewalls 33a, and in the upper ends of sidewalls 33a in a vicinity of a ceiling of retaining plate 33, heat insulated plate 38 is integrally formed. The upper face of heat insulated plate 38 includes a plurality of projections 38a each integrally projecting therefrom. Projections 38a are between plate 38 and board 50. There is air layer S between plate 38 and board 50.

Control board 50 is positioned by hook-shaped hooks 33b. Each of hooks 33b integrally projects from the pair of sidewalls 33a or heat insulated plate 38 of retaining plate 33. Hooks 33b are individually latched in a plurality of recesses 54 of board 50. Projections 38a of plate 38 maintain air layer S with a constant thickness between plate 38 and board 50.

According to connection box 10 of the above described embodiment, as shown in FIG. 12, bent part 26d is retained between terminal pressing parts 35 and 43 of plate 30 and cover 40. Plate 30 and cover 40 face board 21 with predetermined clearances therebetween. Therefore, between bent potion 26d and the other end 26b of each terminal 26, parallel deformation of board 21 is able to be tolerated.

Heat generated by an engine produces difference in thermal expansion between board 21, plate 30 and cover 40, and stress induced by this thermal expansion difference acts on terminal 26. The stress is absorbed by the deformation between bent portion 26d and the other end 26b.

When the connector components such as plug-in relays 16, fuse 17, or external connector 18 are attached to/detached from the displacing part of one end 26a of each terminal 26, vertical mechanical stress acts on terminal 26. Such stress is taken in between pressing parts 35 and 43 of plate 30 and cover 40, which retain bent part 26d.

Bent portion 26d is able to relieve the effects of the thermal stress or the mechanical stress on soldered part H2 of terminal 26. Soldered part H2 prevents generation of solder crack.

This embodiment can be applied to an electronic control unit as a separate body from a connection box or a connection box not incorporating an electronic control unit.

The entire contents of Japanese Patent Applications P2002-006994 (filed on Jan. 16, 2002) are incorporated herein by reference.

Although the invention has been described above by reference to certain embodiments of the invention, the invention is not limited to the embodiments described above. Modifications and variations of the embodiments described above will occur to those skilled in the art, in light of the above teachings. The scope of the invention is defined with reference to the following claims.

What is claimed is:

1. A terminal mounting structure comprising:
a first component;
a second component separated away from the first component; and
a terminal for interconnecting the first and second components,
the terminal comprising:
a first portion fixedly attached to the first component;
a second portion fixedly attached to the second component;
a deformable third portion interconnecting the first and second portions and extending orthogonally to the first and second portions;
a retaining member, which comprises a plurality of pressing parts,
wherein more than half of a length of the third portion is retained between the plurality of pressing parts, with a space between the retaining member and one of the first and second components.

2. The terminal mounting structure of claim 1, wherein a center of the length of the third portion is retained between the plurality of pressing parts.

3. The terminal mounting structure of claim 1, wherein the plurality of pressing parts do not physically contact the first portion or the second portion.

4. The terminal mounting structure of claim 1, wherein the plurality of pressing parts do not physically contact bends in the terminal.

5. A terminal mounting structure, comprising:
a board; and
a terminal mounted on the board,
the terminal comprising:
a first end removably connected to a connection component;
a second end soldered to the board in a raised position; and
a bent portion at intermediate of the terminal and at respective angles relative to respective first and second ends; and
a retaining member, which comprises a plurality of pressing parts, facing the board with a space therebetween, and retaining the bent portion between the plurality of pressing parts,
wherein the plurality of pressing parts do not physically contact portions of the terminal other than the bent portion.

6. The terminal mounting structure of claim 5, wherein more than half of a length of the bent portion is retained between the plurality of pressing parts.

7. The terminal mounting structure of claim 6, wherein a center of the length of the bent portion is retained between the plurality of pressing parts.

8. The terminal mounting structure of claim 5, wherein the plurality of pressing parts do not physically contact bends in the terminal.

9. A method of mounting a terminal comprising:
forming a bent portion between first and second ends of a terminal with respective angles relative to corresponding first and second ends;
facing a retaining member to a board with a space for retaining the bent portion; and
removably connecting a first end of a terminal to a connection component and mounting a second end of the terminal to a board in a raised position,
wherein the bent portion is parallel to the board,
wherein the retaining member comprises a plurality of pressing parts, and
wherein more than half of a length of the bent portion is disposed between the plurality of pressing parts of the retaining member.

10. The method of mounting a terminal of claim 9, wherein a center of the length of the bent portion is disposed between the plurality of pressing parts.

11. The method of mounting a terminal of claim 9, wherein the plurality of pressing parts do not physically contact portions of the terminal other than the bent portion.

12. The method of mounting a terminal of claim 9, wherein the plurality of pressing parts do not physically contact bends in the terminal.

* * * * *